United States Patent
Oishi et al.

(10) Patent No.: US 10,559,679 B2
(45) Date of Patent: Feb. 11, 2020

(54) NITRIDE SEMICONDUCTOR EPITAXIAL SUBSTRATE

(71) Applicant: CoorsTek KK, Shinagawa-ku, Tokyo (JP)

(72) Inventors: Hiroshi Oishi, Hadano (JP); Noriko Omori, Hadano (JP); Yoshihisa Abe, Hadano (JP)

(73) Assignee: COORSTEK KK, Shinagawa-Ku, Tokyo (JP)

( * ) Notice: Subject to any disclaimer, the term of this patent is extended or adjusted under 35 U.S.C. 154(b) by 0 days.

(21) Appl. No.: 16/104,148

(22) Filed: Aug. 17, 2018

(65) Prior Publication Data
US 2019/0074369 A1    Mar. 7, 2019

(30) Foreign Application Priority Data

Sep. 6, 2017 (JP) .................................. 2017-171226
Jul. 24, 2018 (JP) .................................. 2018-138174

(51) Int. Cl.
| | | |
|---|---|---|
| *H01L 29/778* | (2006.01) | |
| *H01L 29/06* | (2006.01) | |
| *H01L 29/20* | (2006.01) | |
| *H01L 29/205* | (2006.01) | |
| *H01L 21/02* | (2006.01) | |

(52) U.S. Cl.
CPC ...... *H01L 29/7787* (2013.01); *H01L 21/0254* (2013.01); *H01L 21/0262* (2013.01); *H01L 29/0684* (2013.01); *H01L 29/205* (2013.01); *H01L 29/2003* (2013.01)

(58) Field of Classification Search
CPC ............. H01L 21/0254; H01L 29/2003; H01L 29/205; H01L 29/7787
See application file for complete search history.

(56) References Cited

U.S. PATENT DOCUMENTS

2012/0313145 A1* 12/2012 Makabe ............ H01L 21/02378
257/194
2015/0357454 A1* 12/2015 Lutgen ................ H01L 29/7783
257/76

FOREIGN PATENT DOCUMENTS

| JP | 2003-229439 A | 8/2003 |
|---|---|---|
| JP | 2004-200711 A | 7/2004 |

* cited by examiner

*Primary Examiner* — David C Spalla
(74) *Attorney, Agent, or Firm* — Buchanan, Ingersoll & Rooney PC

(57) ABSTRACT

There is provided a nitride semiconductor epitaxial substrate having a channel layer, a spacer layer, and an electron supply layer that are stacked in this order. The channel layer is GaN. The spacer layer is $Al_aGa_{1-a}N$ ($0<a<0.5$). The electron supply layer is $Al_xIn_yGa_{1-x-y}N$ ($0<x+y\leq 1$). The spacer layer has a thickness of two molecular layers or less.

2 Claims, 2 Drawing Sheets

COMPARATIVE EXAMPLE 1

EXAMPLE 1

NITRIDE SEMICONDUCTOR EPITAXIAL SUBSTRATE

BACKGROUND OF THE INVENTION

Field of the Invention

The present invention relates to a substrate structure for improving device performance in a nitride semiconductor epitaxial substrate for a power device that can be increased in frequency and output.

Description of the Related Art

In a high electron mobility transistor (HEMT) using a nitride semiconductor, particularly a gallium nitride-based compound semiconductor substrate, a technique is known which improves electric characteristics by interposing a so-called spacer layer between an electron transit layer and an electron supply layer.

JP 2004-200711 A discloses a technique that a nitride-based III-V group compound semiconductor device having a heterostructure includes a first binary compound semiconductor layer forming a channel layer, a ternary mixed crystal semiconductor layer forming a barrier layer and including AlGaN in which a composition ratio of Al and Ga is constant, and a second binary compound semiconductor layer interposed between the first binary compound semiconductor layer and the ternary mixed crystal semiconductor layer. The first binary compound semiconductor layer is GaN. The second binary compound semiconductor layer is AlN of which layer thickness is 1 molecular layer or more and 4 molecular layers or less.

JP 2003-229439 A discloses a compound semiconductor device. The compound semiconductor device has a structure in which an electron supply layer, a spacer layer, and a channel layer each of which comprises a nitride of a group III element essentially containing Ga are joined in this order in a lattice matching manner. The spacer layer is composed of an AlGaN layer. An AlN mixed crystal ratio of a region of the spacer layer in contact with the channel layer is higher than the remaining region.

In the invention disclosed in JP 2004-200711 A, in the case where AlN is used for a spacer layer, that is, the above-described second binary compound semiconductor layer, since the AlN has a very large band gap of 6.2 eV, considering that current injection from a barrier layer to a channel layer is blocked, and a heterostructure does not function when the layer thickness becomes too thick, the film thickness is set to 1 molecular layer or more and 4 molecular layers or less. Consequently, while maintaining steepness at a junction interface, sufficient carrier transport by a tunnel effect can be carried out.

According to the invention disclosed in JP 2003-229439 A, the above-described problem is solved by selectively increasing the AlN mixed crystal ratio in the boundary region with a channel layer, not in an entire AlGaN spacer layer, as compared with the remaining region. In the boundary region, the piezoelectric field effect on a 2DEG layer can be expected most remarkably. That is, by increasing the AlN mixed crystal ratio only in the boundary region, not in the entire spacer layer, more specifically by increasing the AlN mixed crystal ratio while keeping the spacer layer to a thickness at which lattice relaxation does not occur, the influence of piezoelectric field effect on the channel layer is greatly increased. In addition, by increasing the AlN mixed crystal ratio in the boundary region, an energy level at the bottom of the conduction band (Ec) on the spacer layer side increases, and conduction band discontinuity can be increased. Consequently, a spontaneous polarization effect can be also enhanced. As a result, a triangular potential can be formed deep and narrow on the channel layer side as compared with the case where the spacer layer is formed with a uniform composition, and the electron concentration in a 2DEG layer is increased, and also element output is increased.

As described above, any of the above-described inventions is said to be a useful technique in the HEMT structure, but it has been hardly considered, especially that the spacer layer is made thinner enough, and there is room for further improvement.

SUMMARY OF THE INVENTION

In view of the above problems, an object of the present invention is to provide a nitride semiconductor epitaxial substrate having a thin spacer layer and also suitable for a higher performance nitride semiconductor device.

In the nitride semiconductor epitaxial substrate of the present invention, a channel layer, a spacer layer, and an electron supply layer are stacked in this order, the channel layer is GaN, the spacer layer is $Al_aGa_{1-a}N$ (0<a<0.5), the electron supply layer is $Al_xIn_yGa_{1-x-y}N$ (0<x+y≤1), and the spacer layer has a thickness of two molecular layers or less.

Conventionally, there has been a problem that could not effectively suppress the current collapse phenomenon due to the presence of a spacer layer. However, having such a structure, such a problem is significantly improved in a nitride semiconductor epitaxial substrate.

In addition, a nitride semiconductor HEMT using such a nitride semiconductor epitaxial substrate is preferable because it has further excellent electric characteristics.

According to the present invention, it is possible to provide a nitride semiconductor epitaxial substrate in which the problem that cannot effectively suppress the current collapse phenomenon due to the presence of a spacer layer is significantly improved, and the nitride semiconductor HEMT using the nitride semiconductor epitaxial substrate can exhibit excellent electric characteristics.

DESCRIPTION OF THE PREFERRED EMBODIMENTS

Hereinafter, the present invention will be described in detail with reference to the drawings. In the nitride semiconductor epitaxial substrate of the present invention, a channel layer 3, a spacer layer S, and an electron supply layer 4 are stacked in this order, the channel layer 3 is GaN, the spacer layer S is $Al_aGa_{1-a}N$ (0<a<0.5), and the electron supply layer 4 is $Al_xIn_yGa_{1-x-y}N$ (0<x+y≤1). The spacer layer S has a thickness of two molecular layers or less.

Figure 1:
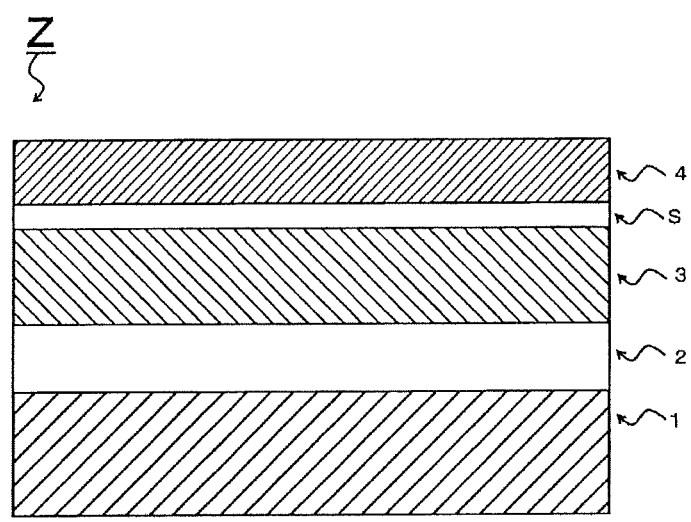
FIG. 1 is a schematic cross-sectional view indicating an embodiment of the nitride semiconductor epitaxial substrate according to the present invention.

FIG. 1 is a schematic cross-sectional view indicating an embodiment of the nitride semiconductor epitaxial substrate according to the present invention. In all of the drawings indicated in the present invention, shapes are schematically simplified and emphasized for explanation, and the shapes, dimensions, and ratios of details are different from the actual shapes, dimensions, and ratios.

A nitride semiconductor substrate Z indicated in FIG. 1 has a buffer layer 2, a channel layer 3, a spacer layer S, and an electron supply layer 4 formed in this order on a base substrate 1. Although not illustrated, further an electrode, and a cap layer as needed, are further provided to form a HEMT.

The present invention exhibits particularly preferable characteristics in the HEMT having a heterointerface and using two-dimensional electron gas (2DEG) generated in the vicinity of the interface as a current path. Thus, the base substrate 1 and the buffer layer 2 are not particularly limited in materials, physical properties, structures, and manufacturing methods thereof, and widely known methods can be used.

Examples of the base substrate 1 include such as silicon single crystal, silicon carbide, sapphire, and gallium nitride (GaN). In these materials, the silicon single crystal tends to be disadvantageous in terms of a withstand voltage in the vertical direction as compared with silicon carbide, sapphire or the like having higher insulating properties, but it is preferable from the point that it is easy to increase the diameter and reduce the cost. Thus, in the present invention, a nitride semiconductor substrate using a silicon single crystal is exemplified.

As the buffer layer 2, for example, the buffer layer structure disclosed in JP 5159858 B2 or JP 5188545 B2 can be used. Specifically, a layer in which the first layer includes AlN having a thickness of 50 to 200 nm, and the second layer includes AlGaN having a thickness of 100 to 300 nm, and a multilayer buffer layer in which an $Al_xGa_{1-x}N$ single crystal layer ($0.6 \leq x \leq 1.0$) and an $Al_yGa_{1-y}N$ single crystal layer ($0 \leq y \leq 0.5$) are alternately and repeatedly deposited in this order from a substrate side, the $Al_xGa_{1-x}N$ single crystal layer ($0.6 \leq x \leq 1.0$) containing carbon at $1 \times 10^{18}$ to $1 \times 10^{21}$ atoms/cm$^3$, the $Al_yGa_{1-y}N$ single crystal layer ($0 \leq y \leq 0.5$) containing carbon at $1 \times 10^{17}$ to $1 \times 10^{21}$ atoms/cm$^3$, can be used. Further, if a high resistance buffer layer, for example, a GaN layer having a carbon concentration of about $1 \times 10^{18}$ to $3 \times 10^{18}$ atoms/cm$^3$ and a thickness of about 100 to 200 nm is in contact with the channel layer 3, it is particularly preferable since a withstand voltage in the vertical direction is improved by the GaN layer.

In the present invention, the channel layer 3 is formed of a nitride semiconductor of a first group 13 element, and the electron supply layer 4 is formed of a nitride semiconductor of a first group 13 element and a second group 13 element. Group 13 elements are gallium (Ga), aluminum (Al), indium (In), and the like. In the present invention, the first group 13 element is one of Ga, Al and In, the second group 13 element is any one of Ga, Al and In and is other than the first group 13 element. A combination that the first group 13 element is Ga, and the second group 13 element is Al is preferable in terms of high degree of freedom in substrate design.

The channel layer 3 and the electron supply layer 4 are not particularly restricted in layer thickness, and the channel layer 3 is generally 0.3 to 3.0 μm thick, and the electron supply layer 4 is 10 to 100 nm thick. Further, the electron supply layer 4 may be doped with various elements. Examples of the various elements include carbon, phosphorus, magnesium, silicon, iron, oxygen, hydrogen, and the like.

In the present invention, the spacer layer S is provided between the channel layer 3 and the electron supply layer 4. Basically, this spacer layer S is also for obtaining the same function as that of the spacer layer in the conventional technique and aimed at compatibility between high output and high electron mobility due to increase in two-dimensional electron gas concentration in the HEMT.

In the present invention, the spacer layer S is $Al_aGa_{1-a}N$ ($0<a<0.5$), the electron supply layer 4 is $Al_xIn_yGa_{1-x-y}N$ ($0<x+y \leq 1$), and the spacer layer S has a thickness of two molecular layers or less, in particular, the layer thickness of the spacer layer S is two molecular layers or less.

Figure 2:
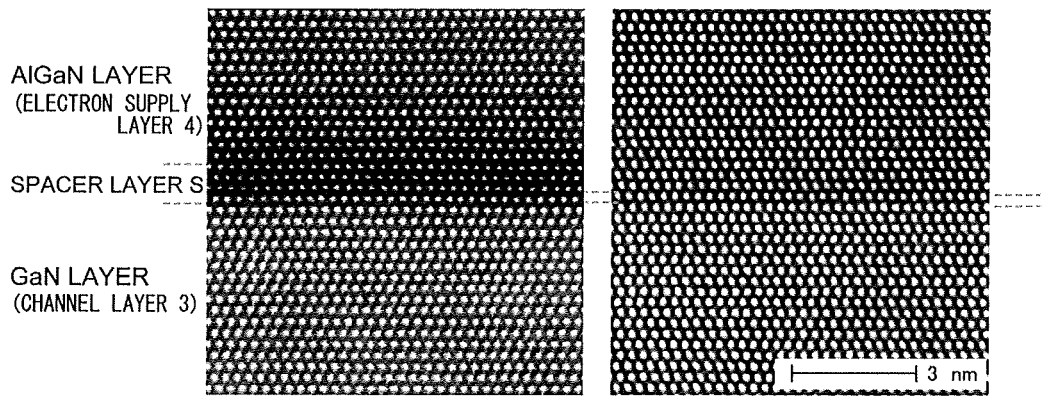
FIG. 2 is a cross-sectional view obtained by STEM observation of the vicinity of an electron supply layer 4/spacer layer S/channel layer 3 and indicates the result of the element ratio obtained by STEM-EDS analysis according to Comparative Example 1 and Example 1.

Such a configuration is specified by observing a cross section of the nitride semiconductor substrate Z with a scanning transmission electron microscope (STEM) and performing element analysis by energy dispersive X-ray spectroscopy (EDS). FIG. 2 shows a cross-sectional view obtained by STEM observation of the vicinity of the electron supply layer 4/spacer layer S/channel layer 3 and the results obtained by STEM-EDS analysis of the vicinity of the electron supply layer 4/spacer layer S/channel layer 3, according to Comparative Example 1 and Example 1. The EDS is performed by an EDS measuring device attached to a STEM device.

The numerical value obtained by EDS is merely a reference value because of its measurement principle. However, an existence ratio of different elements is accurately reflected, and in the present invention, distributions of Al that is a target element can be almost accurately known.

The spacer layer S has a composition of $Al_aGa_{1-a}N$ ($0<a<0.5$). In order to function as a spacer layer, that is, to improve the mobility, Al needs to be present to some extent. As in the present invention, when the channel layer 3 is GaN, the mobility improvement effect is exhibited when the Al composition a exceeds about 0.1, and as the a is larger, the effect becomes higher.

Incidentally, since the spacer layer S is in direct contact with the channel layer 3 made of GaN, due to the difference in lattice constant with GaN which increases in proportion to a, the dislocation density increases due to strain generated at the interface. This increased dislocation density is considered to contribute to deterioration of current collapse.

In addition, in the case of forming a layer by a metal organic chemical vapor deposition method (MOCVD method), the spacer layer S having a composition of $Al_aGa_{1-a}N$ ($0<a<0.5$) contains more carbon than GaN, and it can be said that current collapse is further deteriorated.

Further, the thinner the spacer layer S having the composition of $Al_aGa_{1-a}N$ ($0<a<0.5$) is, the more the spacer layer S is lattice-matched with the GaN of the channel layer. Thus, the defect is hard to occur, and it is effective to suppress current collapse. However, if the thickness is the same, if the value of a is large, the lattice constant difference with GaN increases. As a result, the amount of defects occurred in the Ga channel layer increases.

In summary, when the spacer layer S is composed of $Al_aGa_{1-a}N$ ($0<a<0.5$), from the viewpoint of the current collapse suppression, the smaller thickness the better, and the smaller a the better. However, a is a predetermined value or more. Otherwise, mobility cannot be improved.

Based on the above viewpoints, differences from the prior art will be described in detail below.

In JP 2004-200711 A, a spacer layer having AlN with a layer thickness of 1 molecular layer or more and 4 molecular layers or less is exemplified. That is, current injection inhibition from a barrier layer to a channel layer, which is a disadvantage due to being AlN, is dealt with by reducing the layer thickness. However, it cannot be denied that when AlN and GaN are in direct contact with each other, the occurrence of dislocation at the interface and the high carbon concentration of the AlN layer inevitably deteriorates the performance in comparison with the case where the spacer layer is AlGaN.

According to JP 2003-229439 A, it is preferable that a portion in contact with a channel layer is AlN to make the Al atomic ratio of a spacer layer in contact with the channel layer higher than the rest or to enhance the effect of suppressing alloy scattering, and it is preferable that the layer thickness of the AlN is several atomic layers. That is, also according to JP 2003-229439 A, AlN is preferable at the portion in contact with the channel layer, and it can be said that there is a technical idea to deal with the disadvantage due to being AlN by reducing the layer thickness.

On the other hand, according to the present invention, two parameters, that is, the Al atomic ratio of the spacer layer S in the portion in contact with the channel layer 3 and the thickness of the spacer layer S, have been further studied, and how the relationship with the Al atomic ratio of the spacer layer S affects the HEMT on the basis of reducing the thickness of the spacer layer S have been studied from a new viewpoint.

That is, with the focus on the fact that the existence of the spacer layer S contributes to deterioration of the current collapse, compared with the spacer layers described in JP 2004-200711 A and JP 2003-229439 A, by lowering the Al atomic ratio of the spacer layer S made of AlGaN and by making its thickness thinner, AlGaN and GaN forming the channel layer 3 are further lattice-matched. As a result, the present inventors have found the phenomenon that defects are less likely to occur, and it is effective in suppressing collapse, and there is an optimum value that does not greatly impair the mobility improvement effect inherently possessed by a spacer layer while having the above-described effect.

The present invention has found that the above-described effect can be obtained with the configuration that the layer thickness of the spacer layer S is two molecular layers or less. Since the spacer layer S must necessarily exist, the lower limit is one molecular layer. On the other hand, it has been found that the spacer layer S is disadvantageous in terms of current collapse as it is thick, and thus it can be said that the layer thickness is preferably 2 molecules or less.

In the present invention, the Al atomic ratio in the spacer layer S is preferably evaluated by STEM-EDS. However, it is extremely difficult to accurately evaluate the Al atomic ratio at a thickness of 1 to 2 molecules at present. Thus, even if STEM-EDS is used, quantification with high precision cannot be expected, but for example, it is possible to distinguish between the electron supply layer 4 and the spacer layer S and obtain an approximate Al atomic ratio of each layer.

In FIG. 2, Comparative Example 1 and Example 1 are compared. In Comparative Example 1 in which the spacer layer S is thick, the presence of the spacer layer S can be clearly confirmed from the photograph. Also in Example 1, on the other hand, a shade which can somehow be identified can be confirmed, although the layer thickness is thin, and it is not clear due to the circumstances of resolution. Further, according to Example 1, in the EDS graph of FIG. 2, it seems that there is hardly any difference in the Al atomic ratio between the spacer layer S and the electron supply layer 4, but from the analysis result of the numerical data, the Al atomic ratio of the spacer layer S is 20%, and the Al atomic ratio of the electron supply layer 4 is 15%.

Figure 3:
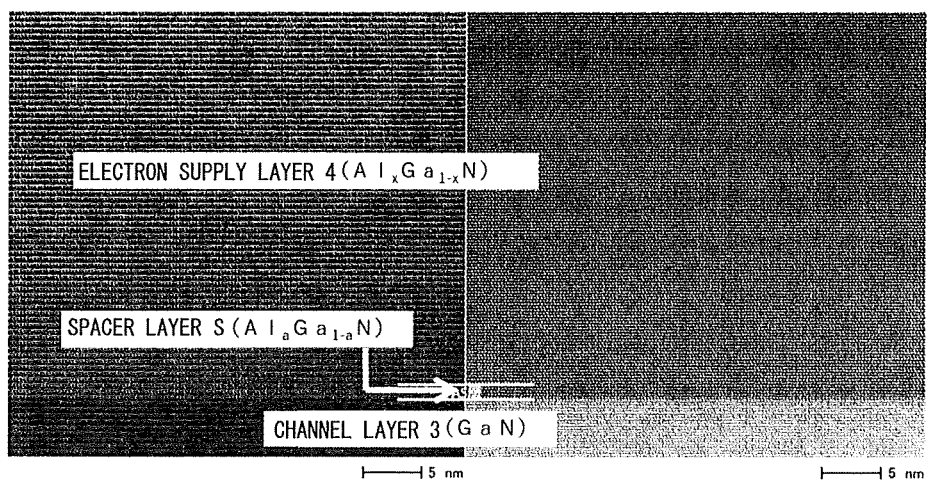
FIG. 3 is a bright-field STEM image (left) and an HAADF-STEM image (right) of the vicinity of the electron supply layer 4/spacer layer S/channel layer 3 according to Example 1, which are obtained by cross-section STEM observation at low magnification as compared with FIG. 2.

FIG. 3 is a bright-field STEM image (left) and an HAADF-STEM image (right) obtained by observation at further low magnification as compared with FIG. 2, in order that the boundary in the vicinity of the interface between the spacer layer S and the electron supply layer 4 in cross-sectional view of Example 1 shown in FIG. 2 can be more clearly seen. The HAADF-STEM image becomes darker the larger the number of light atoms (here, the more the composition of AlGaN is enriched with Al), because it reveals the Z contrast. FIG. 3 indicates three layers each having different contrast, which include from the bottom, the brightest "GaN layer", the darkest "spacer layer", and the "AlGaN layer" of middle brightness between said two. This clearly demonstrates that in the part of the channel layer 3 according to the present invention, the spacer layer has a higher composition ratio of Al than the AlGaN electron supply layer.

In the present invention, since the Al atomic ratio in the spacer layer S is higher than that of the electron layer 4, the mobility improvement effect inherently possessed by a spacer layer is well retained. This is preferred over the case where there is no difference between the Al atomic ratio in the spacer layer S and that of the electron layer 4.

The atomic ratio of Al in the electron supply layer 4 is preferably 10% or more and 30% or less. That is, in $Al_xIn_yGa_{1-x-y}N$ (0<x+y≤1), it is preferable that x is 0.1 to 0.3, y is 0 to 0.9, and x+y≤1. The thickness of the electron supply layer 4 is not particularly limited, but it is suitably designed between 10 nm and 60 nm.

A profile shape according to the Al atomic ratio of the spacer layer S can be appropriately obtained by a MOCVD method, by optimizing a timing of supply of Al source gas, in addition to adjusting various source gases, a flow rate of carrier gas, and a pressure in a reactor, from immediately after the formation of the channel layer 3.

One preferable embodiment for obtaining the spacer layer S and the electron supply layer 4 according to the present invention by the MOCVD method is a method in which a Ga source gas and an N source gas are used in a reaction chamber of a vapor phase growth system to form a channel layer 3 made of GaN, then the Ga source gas, the N source gas, and the Al source gas are used, in forming the spacer layer and the electron supply layer, to form the spacer layer S in 1.5 to 10 seconds at a chamber internal pressure of 200 to 300 hPa, and then the supply rate of the source gas is rapidly changed to form the electron supply layer while maintaining the deposition temperature at the formation of the spacer layer.

According to such a method, a nitride semiconductor layer with a thickness of 1 to 2 molecules can be formed by the MOCVD method without using a technique such as molecular vapor deposition.

As described above, the nitride semiconductor epitaxial substrate of the present invention has the effect of improving the mobility of two-dimensional electron gas and increasing the speed of a transistor as well as a nitride semiconductor epitaxial substrate having a conventional spacer layer and has a structure of suppressing deterioration of the current collapse phenomenon by introducing a spacer layer and reducing on-resistance of AlGaN/GaN-HEMT devices.

EXAMPLES

Hereinafter, the present invention will be specifically described based on an example. However, the present invention is not limited thereto.

[Common Experimental Conditions]

A p-type silicon single crystal substrate having a diameter of 6 inches, a thickness of 1000 μm, a specific resistance of 0.01 Ωcm, and a plane orientation (111) was prepared as the base substrate 1. After the substrate was cleaned by a known substrate cleaning method, the substrate was set in an MOCVD system. After a temperature increased, and gas was replaced, a heat treatment was performed at a temperature of 1000° C. for 15 minutes, under conditions of a hydrogen 100% atmosphere and a chamber pressure of 135 hPa. Then, a natural oxide film on the surface of the base substrate 1 was removed, and an atomic step of silicon was developed on the surface.

Subsequently, an AlN single crystal having a thickness of 70 nm was formed by using trimethylaluminum (TMAl) and ammonia ($NH_3$) as source gases. Next, an $Al_{0.1}Ga_{0.9}N$ single crystal layer having a thickness of 300 nm was formed by using trimethylgallium (TMG), TMAl, and $NH_3$ as source gases by adjusting a growth temperature to 1000° C. and a chamber pressure to 60 hPa. Next, an AlN single crystal layer with a thickness of 5 nm and an $Al_{0.1}Ga_{0.9}N$ single crystal layer with a thickness of 30 nm were alternately stacked using TMG, TMAl, and $NH_3$ as raw material gases to form a multilayer structure having a layer thickness of about 2450 nm. In this manner, the buffer layer 2 was formed on the base substrate 1.

A GaN single crystal layer having a thickness of 3000 nm was deposited on the buffer layer 2 as the channel layer 3 by adjusting a growth temperature to 1030° C. and a chamber pressure to 200 hPa.

The spacer layers S ($Al_aGa_{1-a}N$) were formed on the channel layer 3 under the conditions described in Example 1 and Comparative Example 1 to be described below.

Then, an $Al_{0.18}Ga_{0.82}N$ single crystal layer having a thickness of 24 nm was formed on the spacer layer S by adjusting a growth temperature to 1000° C. and a chamber pressure to 200 hPa as the electron supply layer 4, and further a GaN layer having a thickness of 4 nm was formed as a cap layer. Through the above-described processes, a nitride semiconductor epitaxial substrate for evaluation was obtained. The thickness and carbon concentration of each layer formed by vapor phase growth were controlled by adjusting a flow rate and supply time of source gases, a substrate temperature, and other known growth conditions.

Example 1

TMG, TMAl, and $NH_3$ were introduced as source gases for 1.5 seconds at a growth temperature of 1030° C. and a chamber internal pressure of 200 hPa to form the spacer layer S on the channel layer 3 in Example 1. As a result of evaluating from FIG. 2, the layer thickness was about 0.25 nm (one molecular layer).

Comparative Example 1

TMG, TMAl, and $NH_3$ were introduced as source gases for 10 seconds at a growth temperature of 1030° C. and a chamber internal pressure of 50 hPa to form the spacer layer S on the channel layer 3 in Comparative Example 1. In this case, the Al content in the spacer layer S is considerably higher than in Example 1, and a high Al concentration region in which the Al composition ratio exceeds 50% in the thickness direction is formed. The layer thickness has been about 1 nm (4 molecular layers).

With respect to the nitride semiconductor epitaxial substrate obtained in Example 1 and Comparative Example 1, cross-section observation and elemental analysis were performed on the spacer layer S and portions of the channel layer 3 and the electron supply layer 4 adjacent to the spacer layer S. Conditions of the cross-section observation and elemental analysis are described below.

[Evaluation 1 to STEM Observation]

Each nitride semiconductor epitaxial substrate was cleaved in the diameter direction, fragments were sampled from the vicinity of the center of a principle plane and sliced by a focused ion beam (FIB) method to obtain a sample for measurement. This sample was observed by a scanning transmission electron microscope (STEM). The equipment used was JEM-ARM 200F made by JEOL Ltd. and the accelerating voltage was 200 kV. The elemental analysis was performed using an EDS measuring device (energy dispersive X-ray spectrometer) (JED-2300T) attached to the STEM under the measurement conditions of an accelerating voltage of 200 kV, a beam diameter of 0.1 nmφ, and an energy resolution of about 140 eV.

[Evaluation 2 to EDS Analysis]

After the above-described STEM observation, EDS measurement was carried out by linearly irradiating a beam on the vicinity of the electron supply layer 4/spacer layer S/channel layer 3 in a width range of 20 nm with 100 points. A beam interval was 0.2 nm, and a measurement time per point was 1 second.

In this measurement, one point near the center of the principle plane of the nitride semiconductor epitaxial substrate was sampled to specify the form of the spacer layer S. Film formation by an MOCVD method can be said to be satisfactory since the film formation is highly accurate. However, the sampling number may be further increased as necessary, for example, by adding two points in the 10 mm inner side from an outer circumference, total three points may be sampled.

[Evaluation 3 to Electron Mobility]

Next, Hall effect measurement by the van der Pauw method was carried out on the same nitride semiconductor epitaxial substrate as the substrate on which the STEM observation and the EDS analysis were carried out, and an electron mobility was evaluated. First, the substrate was diced into chips of 7 mm square, and Ti/Al electrodes of 0.25 mm in diameter were formed by vacuum deposition at four corners on the electron supply layer 4 of each chip. Next, alloying heat treatment was performed at 600° C. for 5 minutes in $N_2$ atmosphere. Then, a Hall effect measurement was carried out by using HL5500PC manufactured by ACCENT.

[Evaluation 4 to Current Collapse]

The current collapse characteristic was evaluated in the following manner. First, grooves of a recess gate region and an element isolation region were formed by dry etching on each of the evaluation nitride semiconductor epitaxial substrates prepared in the above. Then, each of an Au electrode as a gate electrode on the side of the electron supply layer 4, an Al electrode as a source electrode and drain electrodes, and an Al electrode as a backside electrode on the back side of a base substrate were formed by vacuum vapor deposition. Then, in the OFF state in which the HEMT device had been prepared, a constant stress voltage was applied between the source and drain electrodes, and a constant called a collapse factor was calculated from the ratio of the conduction current amount in the ON state before and after the application. The collapse factor indicates that as the value is closer to 1.0, the conduction loss of the element is lowered. When the collapse factor is 0.7 to 1.0: Good, when the collapse factor is 0.5 or more and less than 0.7: Slightly not good, and when the collapse factor is less than 0.5: Not good.

As a result, the electron mobility of Example 1 has been only reduced to about 90% in comparison with Comparative Example 1, but this is a difference that does not cause a serious problem in practical use. On the other hand, the current collapse has been "Good" in Example 1 and "Slightly not good" in Comparative Example 1.

From the above results, it can be said that in Example 1, both the electron mobility improvement effect and the current collapse suppressing effect are achieved at the same time. On the other hand, in Comparative Example 1, the electron mobility has been substantially equal to or higher than that in Example 1, but the current collapse suppression effect has been inferior.

From this fact, the nitride semiconductor epitaxial substrate of the present invention can significantly achieve the suppression of the current collapse without greatly impairing electron mobility. Thus, particularly it is possible to make optimum design that meets individual requirements to desirably have a spacer layer insertion effect to some extent while avoiding adverse effects due to insertion of the spacer layer as much as possible.

What is claimed is:

1. A nitride semiconductor epitaxial substrate, comprising a channel layer, a spacer layer, and an electron supply layer in this order, wherein
   the channel layer is GaN,
   the spacer layer is $Al_aGa_{1-a}N(0<a<0.5)$,
   the electron supply layer is $Al_xIn_yGa_{1-x-y}N$ $0.1 \leq x \leq 0.3$ and y=0), and
   the spacer layer has a thickness of one or two molecular layers wherein the thickness of one molecular layer is 0.25 nm.

2. The nitride semiconductor HEMT using the nitride semiconductor epitaxial substrate according to claim 1.

* * * * *